(12) United States Patent
Kim

(10) Patent No.: US 9,698,168 B2
(45) Date of Patent: Jul. 4, 2017

(54) DISPLAY DEVICE AND METHOD OF FABRICATING THE SAME

(71) Applicant: SAMSUNG DISPLAY CO., LTD., Yongin, Gyeonggi-Do (KR)

(72) Inventor: Duk-Sung Kim, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 5 days.

(21) Appl. No.: 14/717,686

(22) Filed: May 20, 2015

(65) Prior Publication Data

US 2016/0027808 A1 Jan. 28, 2016

(30) Foreign Application Priority Data

Jul. 25, 2014 (KR) ........................ 10-2014-0094804

(51) Int. Cl.
  *G02F 1/136* (2006.01)
  *H01L 27/12* (2006.01)
  *G02F 1/1362* (2006.01)
  *G02F 1/1343* (2006.01)
  *G02F 1/1368* (2006.01)

(52) U.S. Cl.
  CPC .... *H01L 27/1225* (2013.01); *G02F 1/134309* (2013.01); *G02F 1/136227* (2013.01); *H01L 27/1262* (2013.01); *G02F 1/1368* (2013.01); *G02F 2001/134372* (2013.01)

(58) Field of Classification Search
  CPC ............. H01L 27/1225; H01L 27/1262; G02F 1/134309; G02F 1/136227; G02F 2001/134372; G02F 1/1368
  See application file for complete search history.

(56) References Cited

U.S. PATENT DOCUMENTS 6,115,099 A * 9/2000 Yamamoto .............. G02F 1/139
  349/177
6,300,152 B1 * 10/2001 Kim .................... G02F 1/13458
  349/138

(Continued)

FOREIGN PATENT DOCUMENTS

KR  1020130056748  5/2013
KR  1020140021749  2/2014

(Continued)

*Primary Examiner* — Donald Raleigh
(74) *Attorney, Agent, or Firm* — F. Chau & Associates, LLC

(57) ABSTRACT

An array substrate for a display device includes a first base substrate; a thin film transistor disposed on the first base substrate that includes a semiconductor layer, a gate electrode, a source electrode, and a drain electrode; a first passivation layer that covers the thin film transistor and that includes an inorganic insulating material; a second passivation layer disposed on the first passivation layer that includes an exposure hole that exposes the first passivation layer on the drain electrode; a common electrode disposed on the second passivation layer; a third passivation layer that covers the common electrode and that includes a contact hole inside the exposure hole to expose the drain electrode; a cavity between the first passivation layer and the third passivation layer on the drain electrode; and a pixel electrode disposed on the third passivation layer and connected with the drain electrode.

20 Claims, 9 Drawing Sheets

(56) References Cited

U.S. PATENT DOCUMENTS

| | | | |
|---|---|---|---|
| 6,788,355 B1* | 9/2004 | Ihida | G02F 1/13458 |
| | | | 349/43 |
| 2010/0001277 A1 | 1/2010 | Jeong et al. | |
| 2013/0037814 A1* | 2/2013 | Oh | H01L 21/28008 |
| | | | 257/59 |
| 2013/0214299 A1* | 8/2013 | Ryu | H01L 27/1225 |
| | | | 257/88 |
| 2014/0043554 A1 | 2/2014 | No et al. | |
| 2014/0063429 A1 | 3/2014 | Huh et al. | |

FOREIGN PATENT DOCUMENTS

| | | |
|---|---|---|
| KR | 1020140029021 | 3/2014 |
| KR | 1020140108967 | 9/2014 |

* cited by examiner

DISPLAY DEVICE AND METHOD OF FABRICATING THE SAME

CROSS-REFERENCE TO RELATED APPLICATION

This application claims priority from, and the benefit of, Korean Patent Application No. 10-2014-0094804 filed on Jul. 25, 2014 in the Korean Intellectual Property Office, the contents of which are herein incorporated by reference in their entirety.

BACKGROUND

1. Technical Field

Embodiments of the present disclosure are directed to a display device and a method of fabricating the same, and more particularly, to a display device having an improved display quality and a method of fabricating the same.

2. Discussion of the Related Art

An active matrix display device includes a thin film transistor, which is a switching device or a driving device, and a display device connected to the thin film transistor. The display device may display an image by signals received through the thin film transistor.

A display device also includes a passivation layer that covers the thin film transistor, and the passivation layer may include an inorganic layer or an organic layer. The inorganic layer and the inorganic layer may expose a part of the thin film transistor through a patterning process.

However, a surface of the organic layer may be damaged while etching the inorganic layer, and the roughness of the inorganic layer surface may be increased.

The increase in the surface roughness of the organic layer may cause a defect of a subsequent process, which may degrade the display quality of the display device.

SUMMARY

Embodiments of the present disclosure can provide a display device having a low surface roughness of an organic layer.

Further, embodiments of the present disclosure can provide a method of fabricating the display device.

An exemplary embodiment of the present disclosure provides a display device, including a first base substrate; a thin film transistor disposed on the first base substrate that includes a semiconductor layer, a gate electrode, a source electrode, and a drain electrode; a first passivation layer that covers the thin film transistor and that includes an inorganic insulating material; a second passivation layer disposed on the first passivation layer that includes an exposure hole exposing the first passivation layer on the drain electrode; a common electrode disposed on the second passivation layer; a third passivation layer that covers the common electrode and includes a contact hole disposed inside the exposure hole to expose the drain electrode; a cavity between the first passivation layer and the third passivation layer on the drain electrode; and a pixel electrode disposed on the third passivation layer and connected with the drain electrode.

The first passivation layer may include a silicon nitride layer and a silicon oxide layer disposed on the silicon nitride layer, and the second passivation layer may include a photosensitive organic insulating material.

An internal lateral surface of the exposure hole may be inclined, and the common electrode may extend into the internal lateral surface of the exposure hole.

The cavity separates the common electrode and the pixel electrode, and a distance in the cavity between the common electrode and the pixel electrode may be from about 0.5 µm to about 1 µm.

The semiconductor layer may include an oxide semiconductor.

The display device may further include: a gate line on the first base substrate, a data line on the base substrate that crosses the gate line, a common voltage line that includes the same material as that of the gate line that is parallel to the gate line and crosses the data line; and a contact pad that electrically connects the common voltage line and the common electrode. The gate electrode may protrude from the gate line, and the source electrode may protrude from the data line.

The display device may further include an opposite substrate facing the array substrate; and a liquid crystal layer between the array substrate and the opposite substrate. The opposite substrate may include: a second base substrate; a black matrix disposed on a surface of the second base substrate facing the array substrate; and an overcoat layer that covers the black matrix.

Another exemplary embodiment of the present disclosure provides a method of fabricating a display device, including: forming a thin film transistor on a first base substrate; forming a first passivation layer on the first base substrate that covers the thin film transistor, where the first passivation layer includes an inorganic insulating material; forming a second passivation layer on the first passivation layer; patterning the second passivation layer to form an exposure hole that exposes the first passivation layer on a drain electrode of the thin film transistor; forming a common electrode on the second passivation layer, where the common electrode includes a transparent conductive oxide; forming a third passivation layer on the common electrode; patterning the third passivation layer to expose the common electrode on the drain electrode; etching the common electrode to form a cavity between the first passivation layer and the third passivation layer on the drain electrode; patterning the first passivation layer to expose the drain electrode; and forming a pixel electrode connected to the drain electrode on the third passivation layer.

The second passivation layer may include a photosensitive organic insulating material. The second passivation layer may be patterned by an exposure process, wherein an intensity of ultraviolet light irradiated to a center part of an exposed region of the second passivation layer may differ from an intensity of the ultraviolet light irradiated to an edge part of the exposed region of the second passivation layer.

The method may further include forming a gate line and a data line on the first base substrate, and forming a common voltage line together with the gate line that is parallel to the gate line. The common voltage line may be exposed by patterning the first passivation layer.

The patterning of the third passivation layer may exposes a part of the common electrode on the drain electrode and on the common voltage line, wherein the exposed region of the common electrode may be etched to an internal lateral surface of the exposure hole by adjusting a duration of a wet etching process.

The first passivation layer may include a silicon nitride layer and a silicon oxide layer disposed on the silicon nitride layer. Patterning the first passivation layer may form a first contact hole that exposes the drain electrode, and a second contact hole that exposes the common voltage line. A duration of an etching process that forms the second contact hole may be longer than a duration of the etching process that forms the first contact hole. The third passivation layer may be partially etched on the common voltage line while the second contact hole is being formed, to expose part of the common electrode.

The common voltage line and the common electrode may be electrically connected by a contact pad which is simultaneously formed with the pixel electrode.

Another exemplary embodiment of the present disclosure provides an array substrate that includes a thin film transistor disposed on a first base substrate; a first passivation layer that covers the thin film transistor; a second passivation layer disposed on the first passivation layer that includes an exposure hole with an inclined internal lateral surface that exposes the first passivation layer on a drain electrode of the thin film transistor; a common electrode disposed on the second passivation layer that extends into the internal lateral surface of the exposure hole; a third passivation layer that covers the common electrode and that includes a contact hole disposed inside the exposure hole exposing the drain electrode; a cavity between the first passivation layer and the third passivation layer on the drain electrode; and a pixel electrode disposed on the third passivation layer and connected with the drain electrode, wherein the cavity separates the common electrode and the pixel electrode.

A distance in the cavity between the common electrode and the pixel electrode may be from about 0.5 μm to about 1 μm.

The array substrate of claim 18 may further include a gate line on the first base substrate; a data line on the base substrate that crosses the gate line; a common voltage line that includes a same material as that of the gate line, the common voltage line being parallel to the gate line and crossing the data line; and a contact pad that electrically connects the common voltage line to the common electrode. The thin film transistor may further include a gate electrode protruding from the gate line, a source electrode protruding from the data line, and a semiconductor layer.

DETAILED DESCRIPTION OF EXEMPLARY EMBODIMENTS

Figure 1:
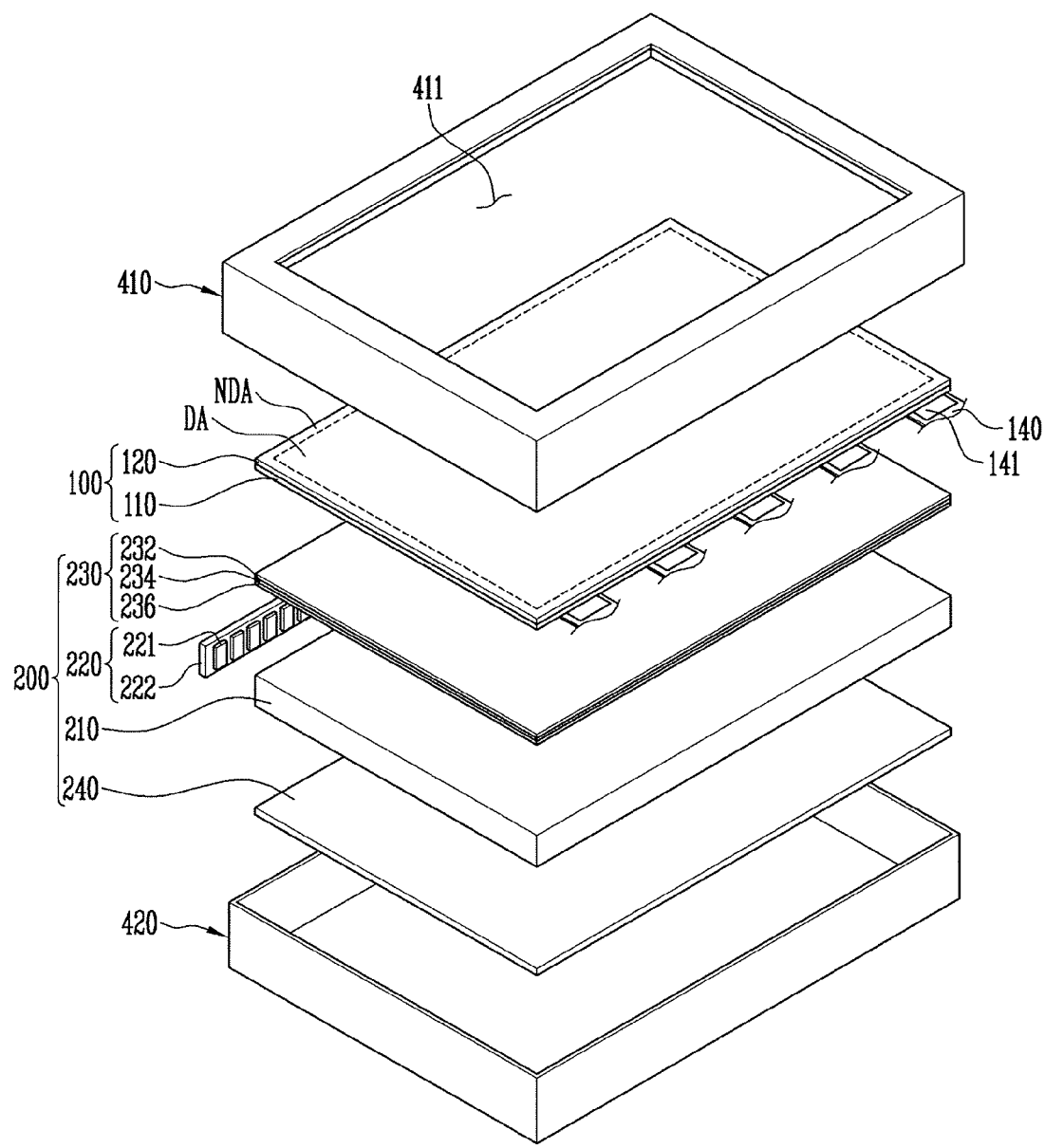
FIG. 1 is an exploded perspective diagram of a liquid crystal device according to an exemplary embodiment of the present disclosure.

Exemplary embodiments will now be described more fully hereinafter with reference to the accompanying drawings; however, they may be embodied in different forms and should not be construed as limited to the embodiments set forth herein. The present disclosure may have various modifications and exemplary embodiments and thus specific exemplary embodiments will be illustrated in the drawings and described. However, it is not intended to limit the present disclosure to the specific embodiments, and it will be appreciated that the present disclosure includes all modifications, equivalences, or substitutions included in the spirit and the technical scope of the present disclosure.

In the drawing figures, dimensions may be exaggerated for clarity of illustration. It will be understood that when an element is referred to as being "between" two elements, it can be the only element between the two elements, or one or more intervening elements may also be present. Like reference numerals may refer to like elements throughout. Herein, when one value is described as being about equal to another value, e.g. "a distance may be from about 0.1 mm to about 1 mm", it is to be understood that the values are equal to each other to within a measurement error, or if measureably unequal, are close enough in value to be functionally equal to each other as would be understood by a person having ordinary skill in the art.

Hereinafter, an exemplary embodiment of the present disclosure will be described in detail with reference to the accompanying drawings.

FIG. 1 is an exploded perspective diagram of a liquid crystal device according to an exemplary embodiment of the present disclosure.

Referring to FIG. 1, a liquid crystal display device includes a liquid crystal display panel 100, a backlight unit 200, an upper cover 410, and a lower cover 420.

The liquid crystal display panel 100 has a rectangular plate shape having a long side and a short side, and includes a display area DA that can display an image, and a non-display area NDA around the display area DA. Further, the liquid crystal display panel 100 includes an array substrate 110, an opposite substrate 120 opposite to the array substrate 110, and a liquid crystal layer interposed between the array substrate 110 and the opposite substrate 120. Further, a planarization film may be attached to each surface of the liquid crystal display panel 100, that is, an outer surface of each of the array substrate 110 and the opposite substrate 120.

A plurality of pixels arranged in a matrix may be disposed on the display area DA of the array substrate 110. Here, each pixel may include a plurality of sub pixels, and each sub pixel may have a different color. For example, the color of each sub pixel may be any one of red, green, blue, cyan, magenta, or yellow. Accordingly, the color of the light emitted from each sub pixel may be any one of red, green, blue, cyan, magenta, or yellow. Further, each pixel may include a gate line, a data line crossing and insulated from the gate line, and a pixel electrode. Further, each pixel may include a thin film transistor electrically connected to the gate line and the data line, and electrically connected to a corresponding pixel electrode. The thin film transistor may switch a driving signal transmitted to the corresponding pixel electrode.

An encapsulation pattern that seals the array substrate 110 and the opposite substrate 120 may be disposed in the non-display area NDA of the array substrate 110.

The opposite substrate 120 may include a color filter that can impart a predetermined color using light from the backlight unit 200, and a common electrode disposed on the color filter opposite to the pixel electrode on one surface thereof. Here, the color filter may be any one of red, green, blue, cyan, magenta, and yellow, and may be formed by a process such as deposition or coating. However, although a present exemplary embodiment is described using a color filter formed on the opposite substrate 120, embodiments of the present disclosure are not limited thereto. For example, the color filter may be formed on the array substrate 110.

Molecules of the liquid crystal layer are aligned in a specific direction by a voltage applied to the pixel electrode and the common electrode, thereby enabling the liquid crystal display panel 100 to display an image by adjusting transmittance of light received from the backlight unit 200.

In addition, a signal input pad may be disposed on an external surface of any one of the array substrate 110 and the opposite substrate 120 in the non-display area NDA. The signal input pad may be connected to a flexible circuit substrate 140 in which a driver IC 141 is embedded, and the flexible circuit substrate 140 may be connected with an external circuit module. The driver IC 141 receives various control signals from the external circuit module, and outputs a driving signal to the thin film transistor in response to the control signals that can drive the liquid crystal display panel 100.

The backlight unit 200 is disposed opposite to a direction from which an image is displayed in the liquid crystal display panel 100. The backlight unit 200 includes a light wave plate 210, a light source unit 220 with a plurality of light sources, an optical member 230, and a reflection sheet 240.

The light guide plate 210 is positioned under the liquid crystal display panel 100, and guides light emitted from the light source unit 220 in the direction of the liquid crystal display panel 100. In particular, the light guide plate 210 overlaps at least the display area DA of the liquid crystal display panel 100. Here, the light guide plate 210 includes an emission surface, through which the light is emitted, a lower surface opposite to the emission surface, and lateral surfaces that connect the emission surface and the lower surface. Further, one or more of the lateral surfaces may be an incident surface opposite to the light source unit 220 to which light emitted from the light source unit 220 is incident, and an opposite lateral surface may be a light facing surface that reflects light. The plurality of light sources 221 in light source unit 220 may be, for example, a plurality of light emitting diodes embedded in a printed circuit board 222.

Here, all of the light sources 221 may emit light having the same color. For example, the light sources 221 may emit white light.

Alternatively, the light sources 221 may emit light having different colors. For example, some of the light sources 221 may emit red light, some of the light sources 221 may emit green light, and the remaining light sources 221 may emit blue light.

The light source unit 220 emits light toward at least one of the lateral surfaces of the light guide plate 210 to provide light through the light guide plate 210 to display an image by the liquid crystal display panel 100.

The optical member 230 is provided between the light guide plate 210 and the liquid crystal display panel 110. The optical member 230 can control light received from the light source unit 220 through the light guide plate 210. Further, the optical member 230 includes a diffusion sheet 236, a prism sheet 234, and a passivation sheet 232, which are sequentially stacked.

The diffusion sheet 236 can diffuse light emitted from the light guide plate 210. The prism sheet 234 can collect light diffused by the diffusion sheet 236 in a direction perpendicular to a plane of the liquid crystal display panel 100 at an upper side thereof. Light passing through the prism sheet 234 is mostly incident to be perpendicular to the liquid crystal display panel 100. The passivation sheet 232 is positioned on the prism sheet 234. The passivation sheet 232 can protect the prism sheet 234 from external impacts.

In a present exemplary embodiment, the optical member 230 includes each of the diffusion sheet 236, the prism sheet 234, and the passivation sheet 232 as an example, but embodiments of the present disclosure are not limited thereto. For example, at least one of the diffusion sheet 236, the prism sheet 234, and the passivation sheet 232 may be overlapped several times, and any one sheet may be omitted as necessary.

The reflection sheet 240 is disposed under the light guide plate 210 and on the lower cover 420 to reflect light generated by the light source unit 220 toward the direction of the liquid crystal display panel 100. The reflection sheet 240 includes a material that reflects light, and may prevent light leakage. As a result, the reflection sheet 240 increases the intensity of light propagating to the liquid crystal display panel 100.

Although a present exemplary embodiment has been described as using an exemplary light source unit 220 disposed to emit light in a direction parallel to a lateral surface of the light guide plate 210, embodiments of the present disclosure are not limited thereto. For example, the light source unit 220 may be disposed to emit light toward the lower surface of the light guide plate 210. Further, the light guide plate 210 may be omitted in the backlight unit 200, and the light source unit 220 may be positioned under the liquid crystal display panel 100, so that light emitted by the light source unit 220 may be emitted directly toward the liquid crystal display panel 100.

The upper cover 410 is disposed at an upper part of the liquid crystal display panel 100. The upper cover 410 includes a display window 411 that exposes the display area DA of the liquid crystal display panel 100. The upper cover 410 may be coupled with the lower cover 420 to support an edge of an entire surface of the liquid crystal display panel 100.

The lower cover 420 is disposed at a lower part of the backlight unit 200. The lower cover 420 includes a space capable of accommodating the liquid crystal display panel 100 and the backlight unit 200. Further, the lower cover 420 may be coupled with the upper cover 410 to accommodate and support the liquid crystal display panel 100 and the backlight unit 200 in an internal space.

Figure 2:
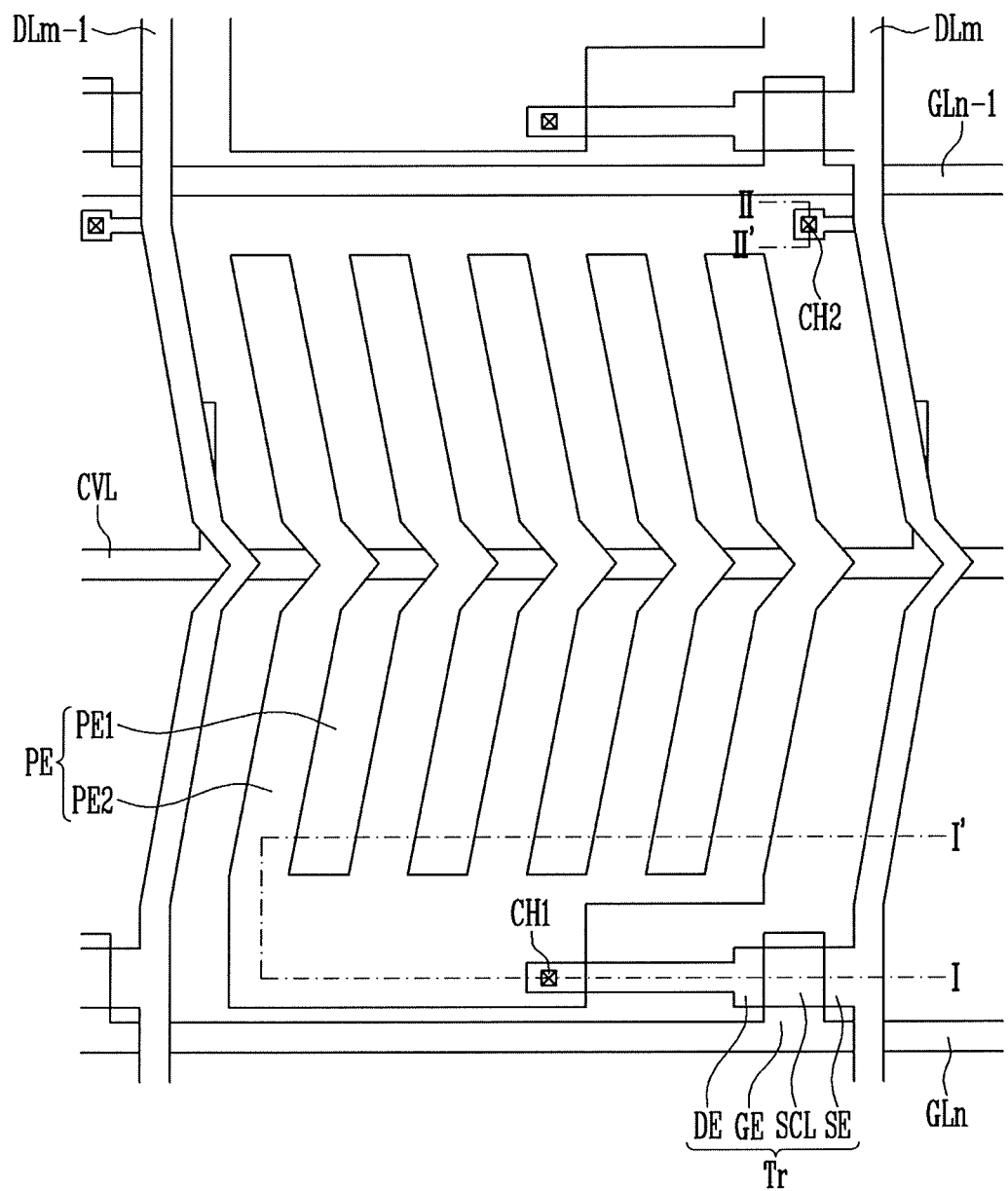
FIG. 2 is a top plane view of one pixel region of a liquid crystal display panel illustrated in FIG. 1.
Figure 3:
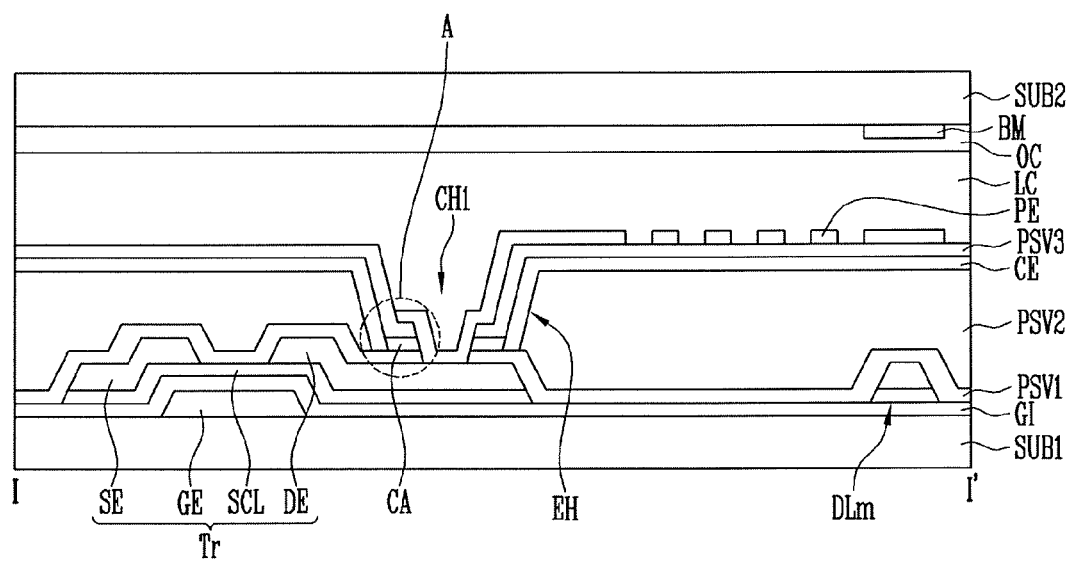
FIG. 3 is a cross-sectional view taken along line I-I' of FIG. 2.
Figure 4:
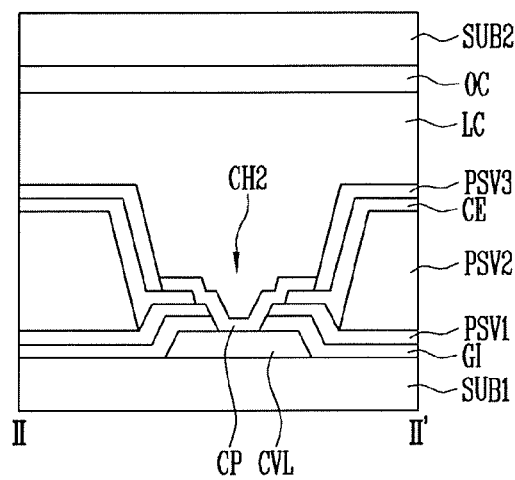
FIG. 4 is a cross-sectional view taken along line II-II' of FIG. 2.
Figure 5:
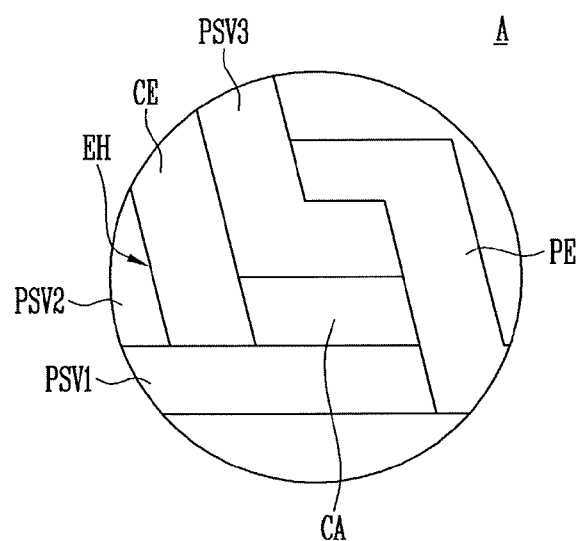
FIG. 5 is an enlarged view of region A of FIG. 3.

FIG. 2 is a top plane view of one pixel region of the liquid crystal display panel illustrated in FIG. 1, FIG. 3 is a cross-sectional view taken along line I-I' of FIG. 2, FIG. 4 is a cross-sectional view taken along line II-II' of FIG. 2, and FIG. 5 is an enlarged view of region A of FIG. 3.

Referring to FIGS. 2 to 5, the liquid crystal display panel 100 includes an array substrate 110, an opposite substrate 120 facing the array substrate 110, and a liquid crystal layer LC interposed between the array substrate 110 and the opposite substrate 120.

The array substrate 110 is a thin film transistor array substrate on which are disposed thin film transistors Tr that can drive liquid crystal molecules of the liquid crystal layer LC, and the opposite substrate 120 may face the array substrate 110.

When power is applied to each thin film transistor Tr of the array substrate 110, an electric field may be formed between the pixel electrode PE connected to the thin film transistor Tr and the common electrode CE corresponding to the pixel electrode PE. The liquid crystal molecules may rotate or align in a specific direction between the array substrate 110 and the opposite substrate 120 by the electric field. Due to the rotation of the liquid crystal molecules, the liquid crystal display panel 100 may block or allow light to pass through. By rotating, the liquid crystal molecules change an alignment direction due to the electric field.

The array substrate 110 may include a first base substrate SUB1 that includes a plurality of pixel regions. The first base substrate SUB1 includes a transparent insulating material to allow light to pass therethrough. Further, the first base substrate SUB1 may be either a rigid substrate or a flexible substrate. A rigid substrate may include a glass substrate, a quartz substrate, a glass ceramic substrate, or a crystalline glass substrate. A flexible substrate may include a film substrate that includes a polymer organic material or a plastic substrate. The material included in the first base substrate SUB1 may be resistant to high processing temperatures in a fabricating process.

n+p gate lines GL1, . . . , GLn, GLn+1, . . . , GL(n+p)−1, and GLn+p, and m+q data lines DL1, . . . , DLm, DLm+1, . . . , DL(m+q)−1, and DLm+q may be disposed on the first base substrate SUB1.

A pixel PXL may be disposed in each of the pixel regions. The pixel PXL may be connected to one of the gate lines GL1, . . . , GLn, GLn+1, . . . , GL(n+p)−1, and GLn+p, and one of the data lines DL1, . . . , DLm, DLm+1, . . . , DL(m+q)−1, and DLm+q.

For convenience of the description, FIG. 2 illustrates the pixel PXL having an $n^{th}$ gate line GLn and an $m^{th}$ data line DLm. Here, each of the plurality of pixels PLX has the same structure, and hereinafter, the $n^{th}$ gate line GLn and the $m^{th}$ data line DLm are referred to as a gate line GLn and a data line DLm, respectively.

The pixel PXL may include a thin film transistor Tr connected to the gate line GLn and the data line DLm, a pixel electrode PE connected to the thin film transistor Tr, a common electrode CE, and a common voltage line CVL parallel to the gate line GLn.

The gate line GLn may extend on the first base substrate SUB1 in a first direction. The data line DLm may extend in a second direction that crosses the first direction with a gate insulating layer GI interposed therebetween. The thin film transistor Tr may include a gate electrode GE, a semiconductor layer SCL, a source electrode SE, and a drain electrode DE. The gate electrode GE may protrude from the gate line GLn. The semiconductor layer SM may overlap the gate electrode GE with the gate insulating layer GI interposed therebetween. The source electrode SE may branch from the data line DLm and may partially overlap the gate electrode. The drain electrode DE is spaced apart from the source electrode SE with the semiconductor layer SM interposed therebetween, and may partially the gate electrode.

Although a present exemplary embodiment has been described with a thin film transistor having a bottom gate structure in which the gate electrode GE of the thin film transistor Tr is positioned under the semiconductor layer SCL, embodiments of the present disclosure are not limited thereto. For example, the thin film transistor Tr may have a top gate structure in which the gate electrode GE is positioned over the semiconductor layer SCL.

A first passivation layer PSV1 may be disposed on the first base substrate SUB1 and may cover the thin film transistor Tr. The first passivation layer PSV1 may include at least one of a silicon nitride (SiNx) or a silicon oxide (SiOx). For example, the first passivation layer PSV1 may include a silicon nitride layer and a silicon oxide layer disposed on the silicon nitride layer.

A second passivation layer PSV2 may be disposed on the first passivation layer PSV1. The second passivation layer PSV2 may include a transparent organic insulating material.

For example, the second passivation layer PSV2 may include at least one of an acryl-based resin (polyacrylates resin), an epoxy resin, a phenolic resin, a polyamide resin, a polyimide resin, an unsaturated polyesters resin, a polyphenylenether resin, a polyphenylenesulfide resin, or benzocyclobutene (BCB).

Further, the second passivation layer PSV2 may include an exposure hole EH that can expose the first passivation layer PSV1 on the drain electrode DE. An internal lateral surface of the exposure hole EH may be inclined.

In addition, the second passivation layer PSV2 may serve as a color filter by having a color added to an organic insulating material. A color of the second passivation layer PSV2 may be any one of red, green, blue, cyan, magenta, yellow, and white.

The common electrode CE may be disposed on the second passivation layer PSV2, and may extend along the internal lateral surface of the exposure hole EH.

The common electrode CE may include a transparent conductive oxide. For example, the common electrode CE may include one of indium tin oxide (ITO) and indium zinc oxide (IZO).

A third passivation layer PSV3 may cover the common electrode CE. The third passivation layer PSV3 may include an inorganic insulating material or an organic insulating material. For example, the third passivation layer PSV3 may include a silicon oxide (SiOx).

In addition, a space or cavity CA may be disposed between the first passivation layer PSV1 and the third passivation layer PSV3 on the drain electrode DE.

The pixel electrode PE may be disposed on the third passivation layer PSV3, and may be connected to the drain electrode DE through a first contact hole CH1. Here, the first contact hole CH1 may be disposed inside the exposure hole EH to expose the drain electrode DE. The pixel electrode PE may include the same material as that of the common electrode CE. That is, the pixel electrode PE may include one of indium tin oxide (ITO) and indium zinc oxide (IZO).

Further, the pixel electrode PE may include a plurality of incisions PE1, and a plurality of branches PE2 defined by the incisions PE1. The incisions PE1 may extend in a direction inclined with respect to the second direction of the data line DLm.

The pixel electrode PE may be spaced apart and insulated from the common electrode CE by the cavity CA. Here, a distance between the pixel electrode PE and the common electrode may be from about 0.5 µm to about 1 µm. When the distance between the pixel electrode PE and the common electrode is smaller than about 0.5 µm, the pixel electrode PE and the common electrode CE may form a short circuit.

Further, when the distance between the pixel electrode PE and the common electrode exceeds about 1 µm, a region of the pixel PXL through which light does not pass may increase. Accordingly, a display quality of the liquid crystal display panel 100 may deteriorate.

The common voltage line CVL may be disposed on the same layer as that of the gate line GLn, and may include the same material as that of the gate line GLn. Further, the common voltage line CVL may be disposed parallel to the gate line GLn and cross the pixel region.

The common voltage line CVL may be connected with the common electrode CE through a contact pad CP in a second contact hole CH2. The common voltage line CVL transmits a predetermined common voltage to the common electrode CE. A plurality of common voltage lines CVL may be connected with each other to receive the common voltage from a common voltage application unit disposed outside the display area.

The opposite substrate 120 may include a second base substrate SUB2, a black matrix BM, and an overcoat layer OC.

The black matrix BM may be disposed facing the array substrate 110 of the second base substrate SUB2. The black matrix BM may be disposed in a region that corresponds to the region in which the data line DLm is formed, and can prevent light leakage that may result from an erroneous alignment of the liquid crystal molecules.

The overcoat layer OC may cover the black matrix BM. Further, the overcoat layer OC may planarize steps due to the black matrix BM.

FIGS. 6 to 19 are cross-sectional views that illustrate a method of fabricating the display panel illustrated in FIGS. 1 to 5. FIGS. 6 to 12 are cross-sectional views along line I-I' in FIG. 2, and FIGS. 13 to 19 are cross-sectional views along line II-II' in FIG. 2.

Figure 6:
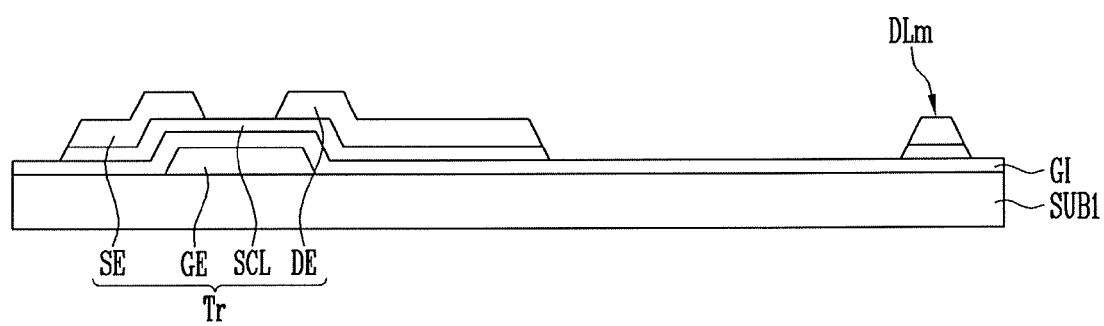
FIGS. 6 to 12 are cross-sectional views line I-I' illustrated in FIG. 2 that illustrate a process of fabricating the display panel illustrated in FIGS. 1 to 5.
Figure 13:
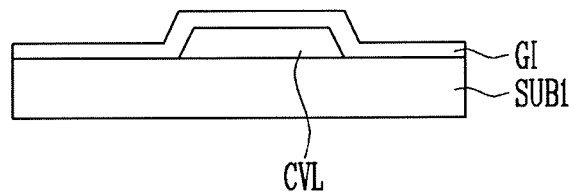
FIGS. 13 to 19 are cross-sectional views along line II-II' illustrated in FIG. 2 that illustrate a process of fabricating the display panel illustrated in FIGS. 1 to 5.

Referring to FIGS. 6 and 13, a first base substrate SUB1 is prepared that has a plurality of pixel regions. Next, a gate line GLn, a data line DLm, a thin film transistor Tr, and a common voltage line CVL are formed on the first base substrate SUB1.

A method of fabricating the gate line GLn, the data line DLm, the thin film transistor Tr, and the common voltage line CVL will be described in more detail as follows.

The gate line GLn and gate electrode GE are formed by depositing a conductive material on the first base substrate SUB1 and patterning the first base substrate SUB1. Here, the common voltage line CVL may be formed together with the gate line GLn. The gate line GLn, the gate electrode GE, and the common voltage CVL may include at least one of aluminum (Al), silver (Ag), tungsten (W), copper (Cu), nickel (Ni), chrome (Cr), molybdenum (Mo), titanium (Ti), platinum (Pt), tantalum (Ta), neodymium (Nd), scandium (Sc), or an alloy thereof.

After forming the gate line GLn, the gate electrode GE, and the common voltage CVL, a gate insulating layer GI is formed that covers the gate line GLn, the gate electrode GE, and the common voltage line CVL. The gate insulating layer GI may include at least one of a silicon oxide (SiNx) or a silicon nitride (SiOx).

After forming the gate insulating layer GI, a semiconductor material layer that includes a semiconductor is formed on the gate insulating layer GI. The semiconductor may be amorphous silicon, polycrystalline silicon, single crystal silicon, or an oxide semiconductor. Further, the oxide semiconductor may include at least one of zinc (Zn), indium (In), gallium (Ga), tin (Sn), or a mixture thereof. For example, the semiconductor material layer may include indium-gallium-zinc oxide (IGZO).

After forming the semiconductor material layer, a conductive layer is formed by depositing a conductive material on the semiconductor material layer. Next, the semiconductor layer SCL, the data line DLm, the source electrode SE and the drain electrode DE are formed by patterning the conductive layer and the semiconductor material layer. Accordingly, the thin film transistor Tr may be fabricated.

The conductive layer from which the data line DLm, the source electrode SE, and the drain electrode DE are patterned may include a barrier layer disposed on the semiconductor layer SCL, a main wiring layer disposed on the barrier layer, and a capping layer disposed on the main wiring layer.

The main wiring layer includes one of copper or a copper alloy.

The barrier layer may prevent copper in the main wiring layer from diffusing into the semiconductor layer SCL. Further, copper from the main wiring layer may combine with oxygen in the capping layer to prevent copper oxide from being generated in a subsequent process.

The barrier layer and the capping layer may include the same material. For example, the barrier layer and the capping layer may include one of indium-zinc oxide (IZO), gallium-zinc oxide (GZO), or aluminum-zinc oxide (AZO).

Figure 7:
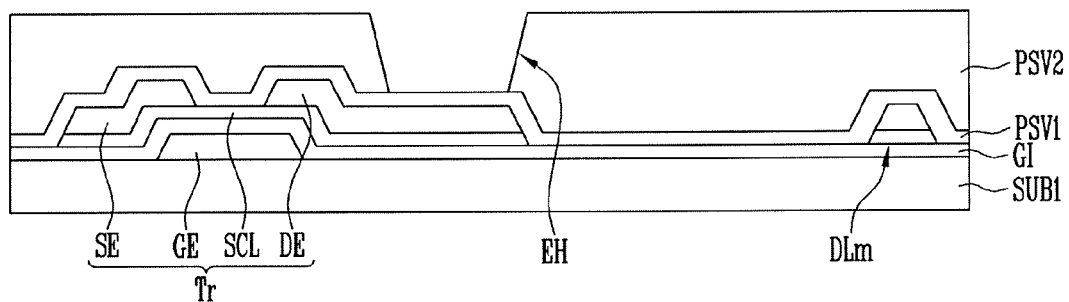
Figure 14:
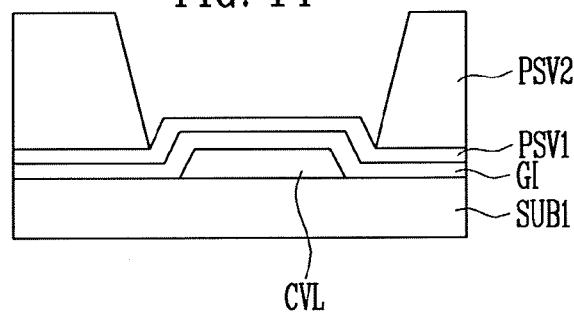

Referring to FIGS. 7 and 14, after forming the thin film transistor Tr, a first passivation layer PSV1 is formed that covers the thin film transistor Tr and the data line DLm.

The first passivation layer PSV1 may include at least one of a silicon nitride (SiNx) and a silicon oxide (SiOx). For example, the first passivation layer PSV1 may include a silicon nitride layer and a silicon oxide layer disposed on the silicon nitride layer.

After forming the first passivation layer PSV1, a second passivation layer PSV2 is formed on the first passivation layer PSV1.

The second passivation layer PSV2 may include a transparent organic insulating material. For example, the second passivation layer PSV2 may include at least one of an acryl-based resin, such as a polyacrylate resin, an epoxy resin, a phenolic resin, a polyamide resin, a polyimide resin, an unsaturated polyester resin, a polyphenylenether resin, a polyphenylenesulfide resin, or benzocyclobutene (BCB).

After forming the second passivation layer PSV2, the second passivation layer PSV2 is patterned to form an exposure hole EH that exposes the first passivation layer PSV1 on the drain electrode DE and the common voltage line CVL.

The exposure hole EH may be formed through an exposure process. This will be described in more detail as follows. The organic insulating material included in the second passivation layer PSV2 may be photosensitive to ultraviolet (UV) light. Accordingly, when UV light is irradiated onto a region of the second passivation layer PSV2 to be patterned, a development process is performed, after which the irradiated region of the second passivation layer PSV2 may be removed. The patterning of the second passivation layer PSV2 may be completed by curing the second passivation layer PSV2.

An intensity of the UV light irradiated to a center part of the exposed region of the second passivation layer PSV2 may differ from an intensity of the UV light irradiated to an edge part of the exposed region of the second passivation layer PSV2. That is, the depth to which UV light permeates in a center part and an edge part of the second passivation layer PSV2 may differ. Accordingly, an internal lateral surface of the exposure hole EH may be inclined.

Figure 8:
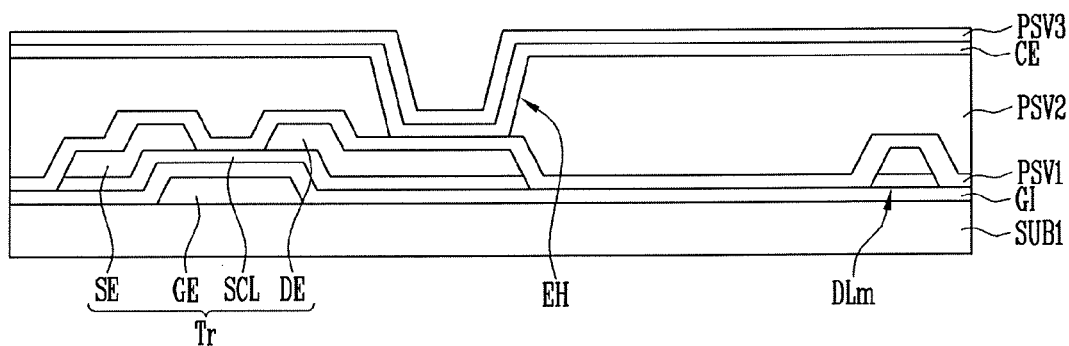
Figure 15:
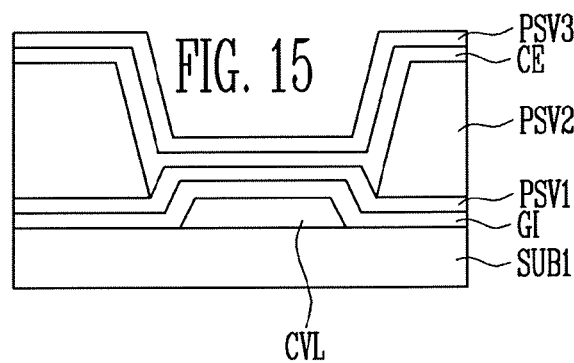

Referring to FIGS. 8 and 15, the first passivation layer PSV1 is exposed on the drain electrode DE and the common voltage line CVL by patterning the second passivation layer PSV2, and then a common electrode CE is formed that includes a transparent conductive oxide. The common electrode CE may have a plate shape on the second passivation layer PSV2, and may be disposed on the internal lateral surface of the exposure hole EH and the portion of first passivation layer PSV1 exposed by the exposure hole EH.

After forming the common electrode CE, a third passivation layer PSV3 is formed that covers the common electrode CE.

The third passivation layer PSV3 may include an inorganic insulating material or an organic insulating material. For example, the third passivation layer PSV3 may include a silicon oxide (SiOx).

Figure 9:
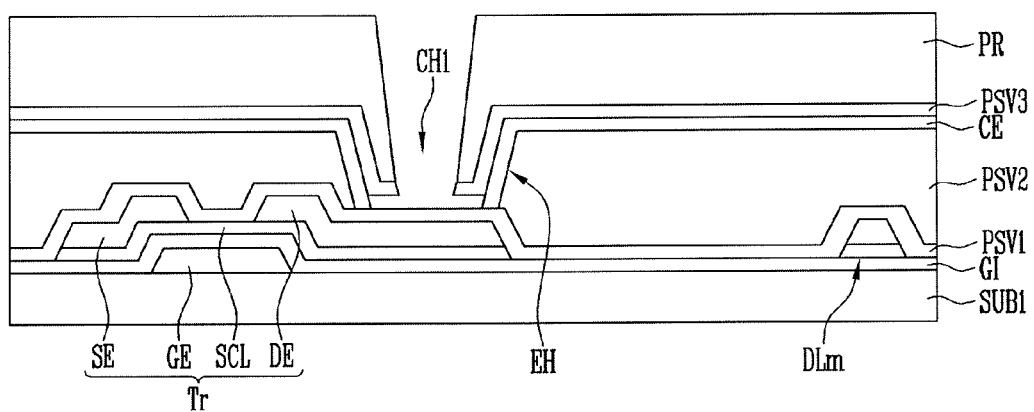
Figure 16:
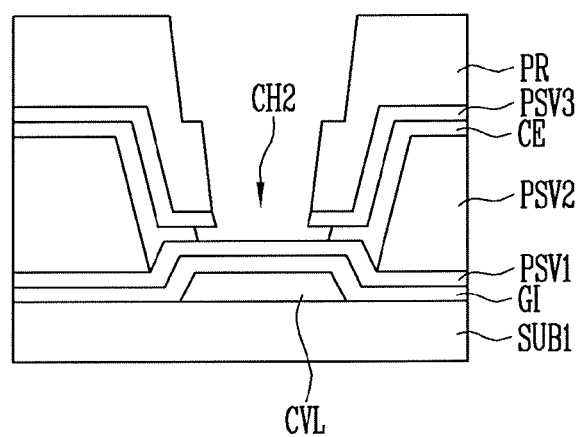

Referring to FIGS. 9 and 16, after forming the third passivation layer PSV3, a photoresist pattern PR is formed on the third passivation layer PSV3 and the common voltage line CVL that exposes the third passivation layer PSV3 inside the exposure hole EH. The photoresist pattern PR may be a half-tone mask on the common voltage line CVL.

After forming the photoresist pattern PR, the third passivation layer PSV3 is patterned. Here, the third passivation layer PSV3 may be patterned using a wet etching process or a dry etching process.

A part of the common electrode CE may be exposed on the drain electrode DE by the patterning of the third passivation layer PSV3. Further, the common electrode CE may be exposed on the common voltage line CVL by the patterning of the third passivation layer PSV3.

After patterning the third passivation layer PSV3, the exposed region of the common electrode CE is etched.

The etching of the common electrode CE may be a wet etching process. Accordingly, an upper part of the third passivation layer PSV3, as well as the region of the common electrode CE exposed by etching the third passivation layer PSV3, may be etched. Here, the common electrode CE is etched to the internal lateral surface of the exposure hole EH by adjusting the duration of the wet etching process.

In addition, by patterning the common electrode CE, a cavity CA may be formed between the first passivation layer and the third passivation layer PSV3 and a part of the first passivation layer PSV1 may be exposed.

Figure 10:
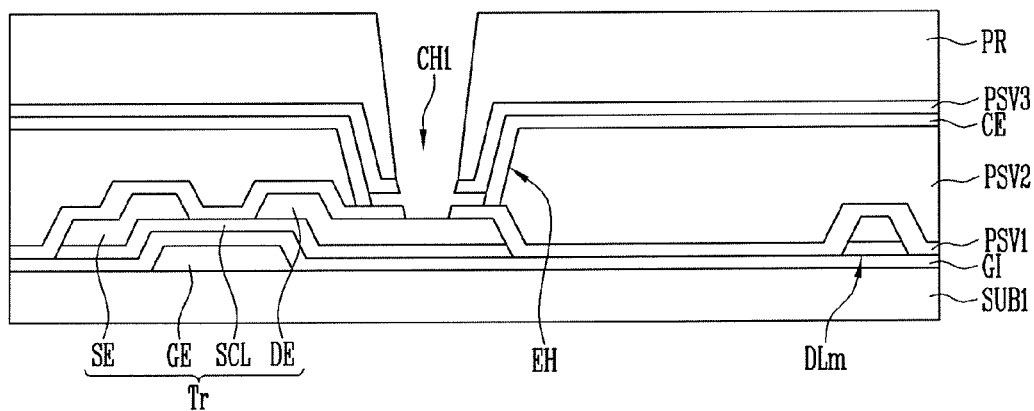
Figure 17:
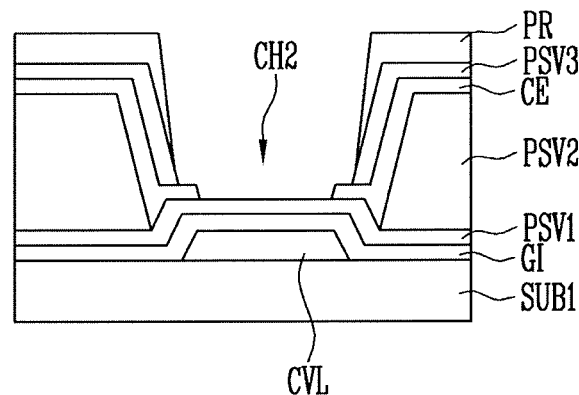

Referring to FIGS. 10 and 17, after patterning the common electrode CE, the first passivation layer PSV1 is patterned. Parts of the drain electrode DE and the common voltage line CVL are exposed by patterning the first passivation layer. Accordingly, a first contact hole CH1 is formed that exposes the drain electrode DE, and a second contact hole CH2 is formed that exposes the common voltage line CVL.

The first passivation layer PSV1 may be patterned using a dry etching process.

A duration of the dry etching process that forms the second contact hole CH2 may be longer than a duration of the dry etching process that forms the first contact hole CH1. Accordingly, after forming the first contact hole CH1, the second contact hole CH2 is formed by removing the gate insulating layer GI from the region in which the second contact hole CH2 is to be formed.

In the meantime, the third passivation layer PSV3 is partially etched on the common voltage line CVL while the second contact hole CH2 is being formed, to expose part of the common electrode CE. The reason is that the photoresist pattern PR on the common voltage line CVL is a half-tone mask.

After patterning the first passivation layer PSV1, the photoresist pattern PR is removed.

Figure 11:
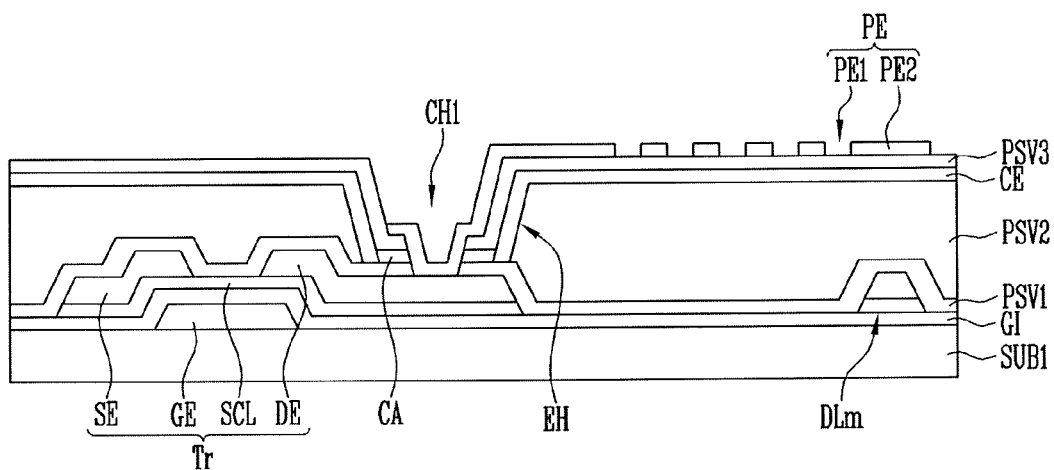
Figure 18:
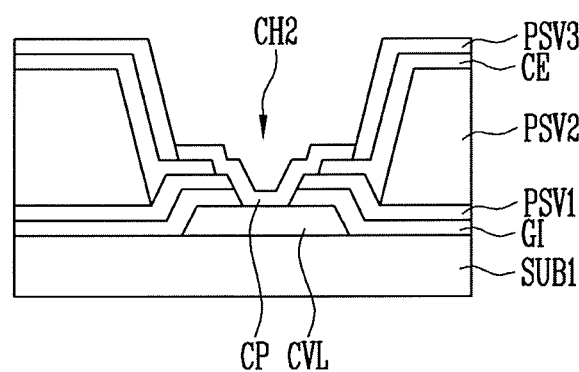

Referring to FIGS. 11 and 18, after removing the photoresist pattern PR, a transparent conductive oxide is deposited on the third passivation layer PSV3, and the transparent conductive oxide is patterned. Accordingly, a first pixel electrode PE that is connected to the drain electrode DE is formed in a region proximal to the first contact hole CH1. The pixel electrode PE may include a plurality of incisions PE1, and a plurality of branches PE2 defined by the incisions PE1. The pixel electrode PE and the common electrode CE may be electrically insulated by the cavity. Here, a distance between the pixel electrode PE and the common electrode, which are spaced apart from each other by the cavity CA, may be from about 0.5 µm to about 1 µm.

Further, a contact pad CP connected with the common voltage line CVL is formed in the second contact hole CH2. The contact pad CP electrically connects the common voltage line CVL and the common electrode CE. Accordingly, the contact pad CP can transmit a common voltage applied from the common voltage line CVL to the common electrode CE.

Figure 12:
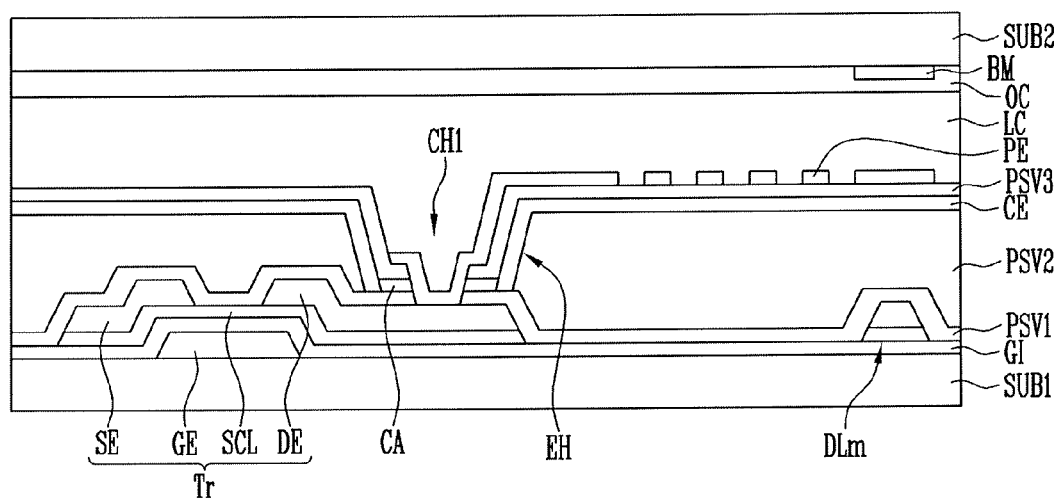
Figure 19:
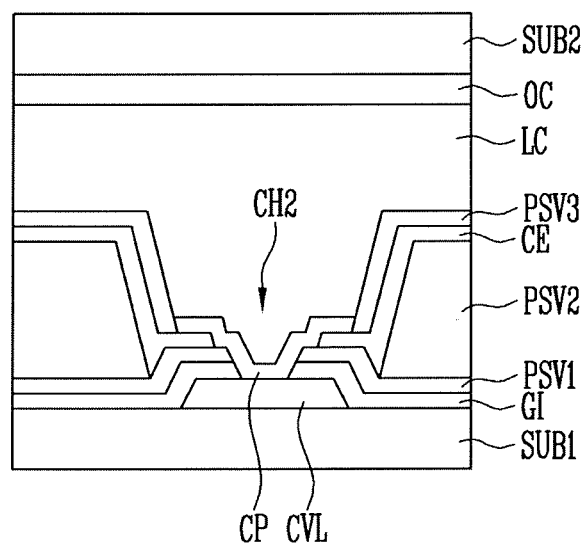

Referring to FIGS. 12 and 19, after forming the pixel electrode PE and the contact pad CP, an opposite substrate 120 is prepared. The opposite substrate 120 may include a second base substrate SUB2, a black matrix BM, and an overcoat layer OC.

After preparing the opposite substrate 120, the opposite substrate 120 is disposed so that the overcoat layer OC faces the pixel electrode PE.

Next, a liquid crystal layer is formed between the opposite substrate 120 and the array substrate 110.

By way of summation and review, in a display device fabricated by an aforementioned fabrication process, the surface of the second passivation layer PSV2 may not be directly exposed to the etching process. Accordingly, a surface of the second passivation layer PSV2 may have a low roughness. Accordingly, a display device that includes the second passivation layer PSV2 may have an improved display quality.

Exemplary embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A display device, comprising:
   a first base substrate;
   a thin film transistor disposed on the first base substrate that includes a semiconductor layer, a gate electrode, a source electrode, and a drain electrode;
   a first passivation layer that covers the thin film transistor and that includes an inorganic insulating material;
   a second passivation layer disposed on the first passivation layer that includes an exposure hole exposing the first passivation layer on the drain electrode;
   a common electrode disposed on the second passivation layer;
   a third passivation layer that covers the common electrode and that includes a contact hole disposed inside the exposure hole exposing the drain electrode;
   a cavity between the first passivation layer and the third passivation layer on the drain electrode; and
   a pixel electrode disposed on the third passivation layer and connected with the drain electrode.

2. The display device of claim 1, wherein the first passivation layer includes a silicon nitride layer and a silicon oxide layer disposed on the silicon nitride layer.

3. The display device of claim 1, wherein the second passivation layer includes a photosensitive organic insulating material.

4. The display device of claim 1, wherein an internal lateral surface of the exposure hole is inclined.

5. The display device of claim 4, wherein the common electrode extends into the internal lateral surface of the exposure hole.

6. The display device of claim 1, wherein the cavity separates the common electrode and the pixel electrode and a distance in the cavity between the common electrode and the pixel electrode is from about 0.5 μm to about 1 μm.

7. The display device of claim 1, wherein the semiconductor layer includes an oxide semiconductor.

8. The display device of claim 1, further comprising:
a gate line on the first base substrate;
a data line on the base substrate that crosses the gate line, wherein the gate electrode protrudes from the gate line, and the source electrode protrudes from the data line;
a common voltage line that includes a same material as that of the gate line, the common voltage line being parallel to the gate line and crossing the data line; and
a contact pad that electrically connects the common voltage line to the common electrode.

9. The display device of claim 1, further comprising:
an opposite substrate facing the array substrate; and
a liquid crystal layer between the array substrate and the opposite substrate,
wherein the opposite substrate includes:
a second base substrate;
a black matrix disposed on a surface of the second base substrate facing the array substrate; and
an overcoat layer that covers the black matrix.

10. A method of fabricating a display device, comprising:
forming a thin film transistor on a first base substrate;
forming a first passivation layer on the first base substrate that covers the thin film transistor, wherein the first passivation layer includes an inorganic insulating material;
forming a second passivation layer on the first passivation layer;
patterning the second passivation layer to form an exposure hole that exposes the first passivation layer on a drain electrode of the thin film transistor;
firming a common electrode on the second passivation layer, wherein the common electrode includes a transparent conductive oxide;
forming a third passivation layer on the common electrode;
patterning the third passivation layer to form a contact hole that exposes the common electrode on the drain electrode;
etching the common electrode to form a cavity between the first passivation layer and the third passivation layer on the drain electrode;
patterning the first passivation layer to expose the drain electrode; and
forming a pixel electrode connected to the drain electrode on the third passivation layer.

11. The method of claim 10, wherein the second passivation layer includes a photosensitive organic insulating material, and the second passivation layer is patterned by an exposure process, wherein an intensity of ultraviolet light irradiated to a center part of an exposed region of the second passivation layer may differ from an intensity of the ultraviolet light irradiated to an edge part of the exposed region of the second passivation layer.

12. The method of claim 11, wherein an internal lateral surface of the exposure hole is inclined, and the common electrode extends into the internal lateral surface of the exposure hole.

13. The method of claim 10, wherein the common electrode and the pixel electrode are spaced apart from each other by the cavity and a distance in the cavity between the common electrode and the pixel electrode is from about 0.5 μm to about 1 μm.

14. The method of claim 12, further comprising:
forming a gate line and a data line on the first base substrate; and
forming a common voltage line together with the gate line that is parallel to the gate line.

15. The method of claim 14, wherein the patterning of the third passivation layer exposes a part of the common electrode on the drain electrode and on the common voltage line, wherein the exposed region of the common electrode is etched to the internal lateral surface of the exposure hole by adjusting adoration of a wet etching process.

16. The method of claim 15, wherein the first passivation layer includes a silicon nitride layer and a silicon oxide layer disposed on the silicon nitride layer,
wherein patterning the first passivation layer forms a first contact hole that exposes the drain electrode, and a second contact hole that exposes the common voltage line, and a duration of an etching process that forms the second contact hole is longer than a duration of the etching process that turns the first contact hole, and
the third passivation layer is partially etched on the common voltage line while the second contact hole is being formed, to expose part of the common electrode.

17. The method of claim 16, further comprising:
forming a contact pad together with the pixel electrode that electrically connects the common voltage line and the common electrode.

18. An array substrate, comprising:
a thin film transistor disposed on a first base substrate;
a first passivation layer that covers the thin film transistor;
a second passivation layer disposed on the first passivation layer that includes an exposure hole with an inclined internal lateral surface that exposes the first passivation layer on a drain electrode of the thin film transistor;
a common electrode disposed on the second passivation layer that extends into the internal lateral surface of the exposure hole;
a third passivation layer that covers the common electrode, and that includes a contact hole disposed inside the exposure hole exposing the drain electrode;
a cavity between the first passivation layer and the third passivation layer on the drain electrode; and
a pixel electrode disposed on the third passivation layer and connected with the drain electrode, wherein the cavity separates the common electrode and the pixel electrode.

19. The array substrate of claim 18, wherein a distance in the cavity between the common electrode and the pixel electrode is from about 0.5 μm to about 1 μm.

20. The array substrate of claim 18, further comprising:
a gate line on the first base substrate;
a data line on the base substrate that crosses the gate line;
a common voltage line that includes a same material as that of the gate line, the common voltage line being parallel to the gate line and crossing the data line; and
a contact pad that electrically connects the common voltage line to the common electrode, wherein the thin film transistor further includes a gate electrode protruding from the gate line, a source electrode protruding from the data line, and a semiconductor layer.

* * * * *